(12) United States Patent
Ruan et al.

(10) Patent No.: US 11,848,178 B2
(45) Date of Patent: Dec. 19, 2023

(54) OPTICAL ABSORPTION SENSOR FOR SEMICONDUCTOR PROCESSING

(71) Applicant: Applied Materials, Inc., Santa Clara, CA (US)

(72) Inventors: Fang Ruan, Milpitas, CA (US); Diwakar Kedlaya, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 392 days.

(21) Appl. No.: 17/085,058

(22) Filed: Oct. 30, 2020

(65) Prior Publication Data

US 2021/0134568 A1    May 6, 2021

Related U.S. Application Data

(60) Provisional application No. 62/930,278, filed on Nov. 4, 2019.

(51) Int. Cl.
*H01J 37/32* (2006.01)
*H01L 21/683* (2006.01)

(52) U.S. Cl.
CPC .. *H01J 37/32844* (2013.01); *H01J 37/32357* (2013.01); *H01J 37/32963* (2013.01); *H01L 21/683* (2013.01)

(58) Field of Classification Search
CPC .......................... H01L 21/683; H01J 37/32357
See application file for complete search history.

(56) References Cited

U.S. PATENT DOCUMENTS 6,534,007 B1    3/2003  Blonigan et al.
2010/0136704 A1* 6/2010  Tran-Thi ............... G01N 21/77
                                                      436/124

(Continued)

FOREIGN PATENT DOCUMENTS

EP         1892047 A2 *  2/2008  ........... B08B 7/0035
KR    2001-0092147 A     10/2001

(Continued)

OTHER PUBLICATIONS

Negative Slope via https://www.cuemath.com/geometry/negative-slope ; pp. 1-4; No date available.*

(Continued)

*Primary Examiner* — Binh X Tran
(74) *Attorney, Agent, or Firm* — Kilpatrick Townsend & Stockton LLP (57) ABSTRACT

Semiconductor processing systems and methods are disclosed. An exemplary semiconductor processing system may include a semiconductor processing chamber containing a solid boron deposit, a remote plasma unit disposed upstream of the semiconductor processing chamber, and an optical absorption sensor disposed downstream of the semiconductor processing chamber. The remote plasma unit may be configured to generate plasma effluents from a fluorine-containing precursor. The optical absorption sensor may be configured to measure within an outflow from the semiconductor processing chamber a level of a boron-containing compound produced via a reaction between at least a portion of the solid boron deposit and the plasma effluents flowed from the remote plasma unit into the semiconductor processing chamber.

8 Claims, 4 Drawing Sheets

(56) References Cited

U.S. PATENT DOCUMENTS

| | | | | |
|---|---|---|---|---|
| 2010/0154835 A1* | 6/2010 | Dimeo | ............... | C23C 16/4405 |
| | | | | 134/31 |
| 2011/0116079 A1 | 5/2011 | Tkachuk | | |
| 2017/0365450 A1* | 12/2017 | Bi | ..................... | H01J 37/32577 |
| 2018/0036775 A1 | 2/2018 | Shah et al. | | |

FOREIGN PATENT DOCUMENTS

| | | |
|---|---|---|
| TW | 440895 B | 6/2001 |
| TW | 2008-02564 A | 1/2008 |
| WO | 00-31773 A1 | 6/2000 |
| WO | 2007-127865 A2 | 11/2007 |

OTHER PUBLICATIONS

Application No. PCT/US2020/058143, International Preliminary Report on Patentability, dated May 19, 2022, 7 pages.
International Search Report and Written Opinion dated Feb. 24, 2021 in International Patent Application No. PCT/US2020/058143, 9 pages.

* cited by examiner

OPTICAL ABSORPTION SENSOR FOR SEMICONDUCTOR PROCESSING

CROSS REFERENCES TO RELATED APPLICATIONS

This application claims the benefit of priority to U.S. Patent Application No. 62/930,278 filed Nov. 4, 2019, the contents of which are hereby incorporated by reference in their entirety for all purposes.

TECHNICAL FIELD

The present technology relates to semiconductor processes and equipment. More specifically, the present technology relates to systems and methods for process end point detection.

BACKGROUND

Integrated circuits are made possible by processes which produce intricately patterned material layers on substrate surfaces. As device sizes continue to shrink in next-generation devices, uniformity of processing conditions continues to increase in importance, chamber designs and system set-up may have an important role in the quality of devices produced. Thus, there is a need for systems and methods that can be used to produce high quality devices and structures.

SUMMARY

Embodiments of the present technology may include a semiconductor processing system. The semiconductor processing system may include a semiconductor processing chamber, a remote plasma unit, and an optical absorption sensor. The semiconductor processing chamber may contain a solid boron deposit. The remote plasma unit may be disposed upstream of the semiconductor processing chamber. The remote plasma unit may be configured to generate plasma effluents from a fluorine-containing precursor. The optical absorption sensor may be disposed downstream of the semiconductor processing chamber. The optical absorption sensor may be configured to measure within an outflow from the semiconductor processing chamber a level of a boron-containing compound produced via a reaction between at least a portion of the solid boron deposit and the plasma effluents flowed from the remote plasma unit into the semiconductor processing chamber.

In some embodiments, the boron-containing compound may include $BF_3$. In some embodiments, the optical absorption sensor may be configured to measure the level of the boron-containing compound ranging between about 1 ppm and about 900,000 ppm. In some embodiments, the optical absorption sensor may include an elongate optical cell. The elongate optical cell may be configured to direct the outflow from the semiconductor processing chamber to flow through at least a portion of the elongate optical cell along a longitudinal axis of the elongate optical cell while the level of the boron-containing compound inside the elongate optical cell may be measured by the optical absorption sensor. In some embodiments, the optical absorption sensor may be configured to measure the level of the boron-containing compound when a pressure inside the elongate optical cell may be between about 1 mTorr and about 10 Torr.

In some embodiments, the optical absorption sensor further may include an infrared detector and a light source disposed at opposing first end and second end of the elongate optical cell, respectively. In some embodiments, the optical absorption sensor may include an optical filter defining the first end of the elongate optical cell and an optical window defining the second end of the elongate optical cell. In some embodiments, light entering into the elongate optical cell through the optical window may include infrared radiation having a wavenumber ranging between about 400 $cm^{-1}$ and about 3,000 $c^{-1}$. In some embodiments, the optical filter may be configured to allow infrared radiation having one or more of the following wavenumbers to pass through: 490±50 cm-1, 695±50 cm-1, 710±50 cm-1, 1,360±50 cm-1, 1,480±50 cm-1, 2,330±50 cm-1, or 2,900±50 cm-1.

In some embodiments, the elongate optical cell may include an inlet disposed proximate the first end of the elongate optical cell and an outlet proximate the second end of the elongate optical cell. The inlet may be configured to provide fluid access to the elongate optical cell from the semiconductor processing chamber. In some embodiments, the optical absorption sensor further may include at least one of a pressure sensor configured to measure a pressure inside the elongate optical cell or a temperature sensor configured to measure a temperature inside the elongate optical cell.

Embodiments of the present technology may further include a method of cleaning a semiconductor system. The method may include forming a remote plasma from a fluorine-containing precursor to produce plasma effluents of the fluorine-containing precursor, and flowing the plasma effluents into a semiconductor processing chamber of the semiconductor system. The semiconductor processing chamber may contain a solid boron deposit. The method may further include removing at least a portion of the solid boron deposit with the plasma effluents. A cleaning byproduct including a boron-containing compound may be formed. The method may also include flowing the cleaning byproduct from the semiconductor processing chamber through an optical absorption sensor. A pressure of the cleaning byproduct flowed through the optical absorption sensor may range between about 1 mTorr and about 10 Torr. The method may further include measuring a level of the boron-containing compound in the cleaning byproduct flowed through the optical absorption sensor.

In some embodiments, the boron-containing compound may include $BF_3$. In some embodiments, the measured level of the boron-containing compound flowed through the optical absorption sensor ranges between about 1 ppm and about 900,000 ppm. In some embodiments, measuring the level of the boron-containing compound in the cleaning byproduct flowed through the optical absorption sensor may include obtaining a boron absorption signal using the optical absorption sensor. In some embodiments, the method may further include determining a process end point when a change slope of the measured level of the boron-containing compound may be less than 0.1 over about 10 seconds.

In some embodiments, the semiconductor processing chamber may include a pedestal configured to move axially along an axis of the semiconductor processing chamber. The method may further include maintaining the pedestal at a first axial position while flowing the plasma effluents into the semiconductor processing chamber. The method may also include maintaining the pedestal at a second axial position while flowing the plasma effluents into the semiconductor processing chamber. In some embodiments, measuring the level of the boron-containing compound flowed through the optical absorption sensor may include measuring a first level of the boron-containing compound flowed through the optical absorption sensor while maintaining the pedestal at the first axial position. In some embodiments, measuring the level of the boron-containing compound flowed through the optical absorption sensor may further include measuring a second level of the boron-containing compound flowed through the optical absorption sensor while maintaining the pedestal at the second axial position. In some embodiments, the method may further include moving the pedestal from the first axial position to the second axial position when a change slope of the measured level of the boron-containing compound may be less than 0.1 over about 10 seconds.

In some embodiments, forming the remote plasma may include forming the remote plasma in a remote plasma unit of the semiconductor processing system. The remote plasma unit may be fluidly coupled with the semiconductor processing chamber. In some embodiments, the fluorine-containing precursor may include $NF_3$.

The present technology may provide numerous benefits over conventional systems and techniques. For example, the present technology may detect the boron-containing compound contained in a cleaning product at extremely low levels under vacuum or near vacuum conditions to avoid under-cleaning or over-cleaning. These and other embodiments, along with many of their advantages and features, may be described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

During semiconductor processing, a hard mask may be deposited. A hard mask of pure boron deposition may improve etch selectivity during subsequent processing as compared to pure carbon or boron-doped carbon hard masks. During deposition of the hard mask material onto a semiconductor substrate, the hard mask material may also be deposited on the exposed surfaces of the semiconductor processing chamber in which a semiconductor substrate may be housed for processing. Particles of the hard mask material deposited on the exposed surfaces of the processing chamber may be released into the chamber during subsequent processing, and the released particles may cause substrate contamination, affect uniformity, and/or reduce process productivity. Thus, cleaning or removal of the hard mask material deposit from the processing chamber may be performed from time to time.

During the cleaning or removal of a boron deposit from the processing chamber, a cleaning byproduct containing a volatile boron-containing compound, such as boron trifluoride ($BF_3$), may be produced. The cleaning byproduct may then be removed from the processing chamber. Currently, there lacks effective methods and systems for detecting the level or concentration of the boron-containing compound included in the cleaning byproduct. Some existing sensors for detecting boron-containing compounds, such as boron trifluoride, may operate under atmospheric pressure, but may not operate under vacuum or near vacuum conditions and/or may lack the detection sensitivity for detecting the boron-containing compound during semiconductor processing. Without being able to effectively and accurately detect the level or concentration of the boron-containing compound contained in the cleaning byproduct, under-cleaning or over-cleaning may occur.

The present technology overcomes these issues by developing an optical absorption sensor that may be installed along a chamber foreline downstream of the processing chamber to detect the start and/or end points of the cleaning process. The optical absorption sensor described herein may operate under vacuum or near vacuum conditions, and may detect the boron-containing compound contained in the cleaning byproduct at extremely low levels. By detecting the level or concentration of the boron-containing compound contained in the cleaning byproduct, under-cleaning or over-cleaning may be avoided, and the cleaning process may be optimized to achieve efficient removal of the boron deposit from the processing chamber. Thus, contaminant particles of the boron deposit may be reduced, substrate processing uniformity may be improved, and/or process productivity may be improved. Further, by utilizing an optical based sensor, such as the optical absorption sensor described herein, the deposition and/or cleaning process may not be interrupted as measurements may be taken without affecting the flow of the processing fluids or gases.

Although the following disclosure routinely identifies end point detection for removing hard mask deposit from a processing chamber, the technology should not be considered to be so limited as for end point detection for a cleaning process only. The technology may be used for end point detection during other semiconductor processes, including but not limited to etching, deposition, baking, etc. Moreover, although end point detection is described to aid understanding of the present technology, the technology should not be considered to be so limited as for process end point detection. The present technology may be used for start point detection and/or monitoring the entire process and determine whether any particular process stage may be achieved or completed. Although an exemplary semiconductor processing system is described, it is to be understood that the present technology can be utilized for any types of semiconductor processing systems or chambers, as well as other applications where low level boron-containing compound detection under vacuum or near vacuum conditions may be beneficial.

Figure 1:
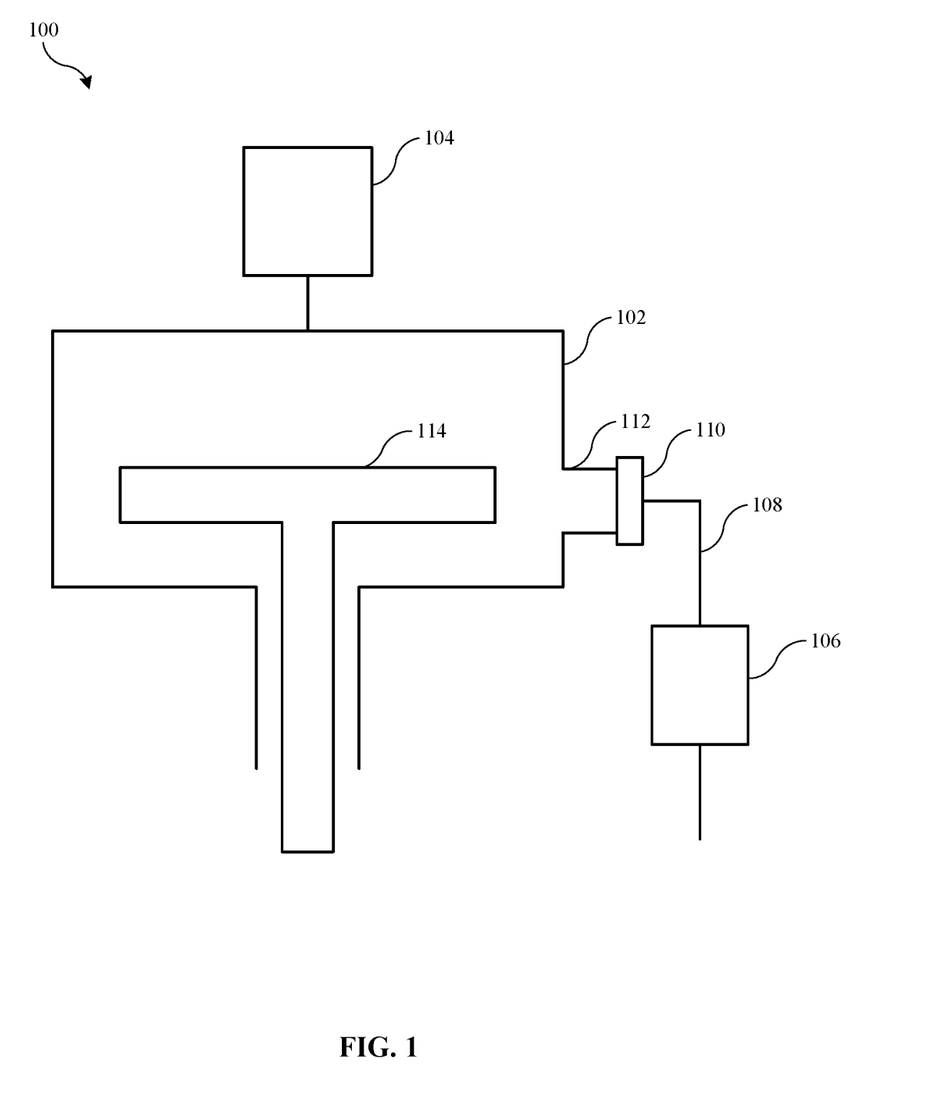
FIG. 1 schematically illustrates an exemplary semiconductor processing system according to embodiments of the present technology.

FIG. 1 schematically illustrates an exemplary semiconductor processing system 100 according to embodiments of the present technology. The semiconductor processing system 100 may include a semiconductor processing chamber 102, a remote plasma unit 104 disposed upstream of the processing chamber 102, and an optical absorption sensor 106 disposed downstream of the processing chamber 102. The remote plasma unit 104 may be fluidly coupled with the processing chamber 102 through a chamber lid, top plate, or showerhead of the processing chamber 102. The optical absorption sensor 106 may be fluidly coupled with semiconductor processing chamber 102 via foreline 108 or any other appropriate pipes, ducts, etc. In some embodiments, a control valve 110, such as a throttle valve, may be disposed between an exhaust port 112 of the processing chamber 102 and the foreline 108. The control valve 110 may be configured to regulate a fluid outflow from the processing chamber 102 to control and/or maintain a pressure inside the processing chamber 102.

In some embodiments, the processing chamber 102 may include a pedestal or substrate support 114. The pedestal 114 may be configured to support a semiconductor substrate (not shown) to be processed within the processing chamber 102. Some exemplary processes that may be carried out in the processing chamber 102 may include deposition, etching, cleaning, baking, etc. As discussed above, in some embodiments, a boron hard mask may be deposited on the semiconductor substrate to improve etch selectivity. While boron may be deposited to the semiconductor substrate, boron may also be deposited on the chamber walls of the processing chamber 102, the pedestal 114, the exhaust port 112, the foreline 108, and/or any other surfaces or components that may be exposed to the processing precursor forming the boron deposit. Thus, a chamber cleaning process may be carried out from time to time to remove the solid boron deposit from the semiconductor processing chamber 102.

In some embodiments, the pedestal 114 may be configured to move axially along an axis of the processing chamber 102, and/or may be maintained at various axial positions. For example, when a semiconductor substrate may be processed in the processing chamber 102, the pedestal 114 may be positioned relatively close to the chamber lid, top plate or showerhead of the processing chamber 102. During the chamber cleaning process, the pedestal 114 may be moved from one axial position to another to direct the flow of a cleaning gas to effectively clean the various portions or parts of the processing chamber 102, as will be discussed in more detail below.

In some embodiments, the cleaning gas may include plasma effluents. Specifically, the remote plasma unit 104 may be configured to generate the plasma effluents from a cleaning precursor. The generated plasma effluents may then be flowed from the remote plasma unit 104 to the processing chamber 102. The cleaning gas may react with the solid boron deposit and produce a volatile byproduct, which may then be removed from the processing chamber 102 through the exhaust port 112 and the foreline 108 by an exhaust pump (not shown). To avoid under-cleaning or over-cleaning, the volatile byproduct may be analyzed. Specifically, a level or concentration of a boron-containing component contained in the volatile byproduct may be measured using the optical absorption sensor 106 to determine whether a desired level of cleaning may be achieved and/or to optimize the cleaning process to avoid over-cleaning and/or under-cleaning.

Figure 2:
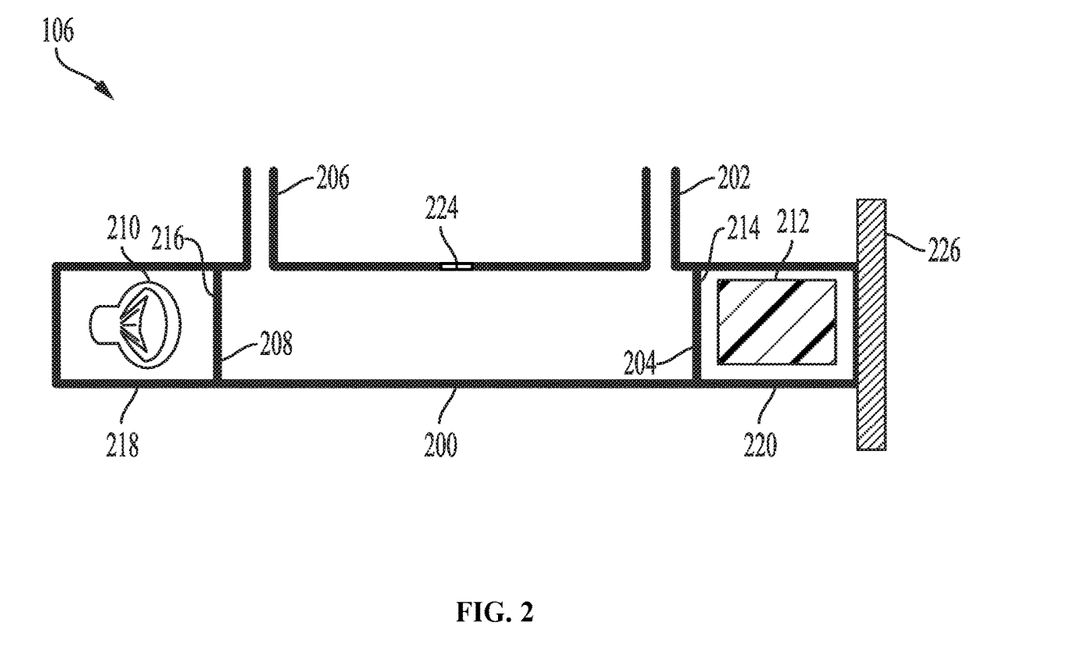
FIG. 2 schematically illustrates an exemplary configuration of an optical absorption sensor according to embodiments of the present technology.

FIG. 2 schematically illustrates an exemplary configuration of the optical absorption sensor 106 according to embodiments of the present technology. The optical absorption sensor 106 may include an optical/infrared based sensor, such as a nondispersive infrared sensor. The optical absorption sensor 106 may include an elongate optical cell 200. The optical cell 200 may include an inlet 202 that may be disposed proximate a first end 204 of the optical cell 200. The first end 204 of the optical cell 200 may be defined by an optical filter as will be discussed in more detail below. The inlet 202 may provide fluid access from the processing chamber 102 to the optical cell 200. The optical cell 200 may further include an outlet 206 disposed proximate a second end 208 of the optical cell 200. The second end 208 of the optical cell 200 may be defined by an optical window as will be discussed in more detail below. The outlet 206 may provide fluid access from the optical cell 200 downstream to the exhaust pump of the semiconductor processing system 100. In some embodiments, the optical cell 200 may be made of metal, such as stainless steel, aluminum with or without surface coating or treatments such as anodization, aluminum oxide, or aluminum nitride. Other suitable material for making the optical cell 200 may be selected based on the fluid flow through the optical cell 200 and various other considerations.

The optical absorption sensor 106 may further include a light source 210 and a light detector 212 disposed at opposite ends of the optical cell 200. An optical filter 214 defining the first end 204 of the optical cell 200 may be disposed between the optical cell 200 and the light detector 212. An optical window 216 defining the second end 208 of the optical cell 200 may be disposed between the optical cell 200 and the light source 210. In the embodiment shown in FIG. 2, the light source 210 may be disposed at the second end 208 of the optical cell 200 and proximate the outlet 206, and the light detector 212 may be disposed at the first end 204 of the optical cell 200 and proximate the inlet 202. In some embodiments, the light source 210 may be disposed at the first end 204 of the optical cell 200 and proximate the inlet 202, and the light detector 212 may be disposed at the second end 208 of the optical cell 200 and proximate the outlet 206. Although the figures illustrate that the inlet 202 and/or the outlet 206 may be disposed at a sidewall of the optical cell 200 and oriented at an angle with respect to the longitudinal axis of the optical cell 200, the inlet 202 and/or the outlet 206 may be disposed at any suitable location of the optical cell 200, such as the opposite ends of the optical cell 200 and/or may be oriented parallel to the longitudinal axis of the optical cell 200.

The light source 210 and the light detector 212 may be placed in a light source compartment 218 and a light detector compartment 220, respectively. In some embodiments, the light source compartment 218 and the light detector compartment 220 may each include a common cross section as the optical cell 200, which may be circular, oval, polygonal, e.g., triangular, square, diamond, rectangular, pentagonal, hexagonal, or of any suitable shape. Thus, the light source compartment 218, the optical cell 200, and the light detector compartment 220 may define an elongate body of the optical absorption sensor 106. In some embodiments, at least one of the light source compartment 218 and/or the light detector compartment 220 may have a different cross sectional size and/or shape from that of the optical cell 200 to accommodate the various light source 210 and/or the light detector 212 that may be utilized for the optical absorption sensor 106.

The optical cell 200 may define a linear optical path for the light emitted from the light source 210. The light source 210, the optical window 216, the optical cell 200, the optical filter 214, and the light detector 212 may be aligned along a longitudinal axis of the optical cell 200 such that the light emitted from the light source 210 may travel through the optical cell 200 and detected by the light detector 212. Thus, when the cleaning byproduct may be flowed through the optical cell 200, the cleaning byproduct may be analyzed using, e.g., optical absorption. For example, a level or concentration of the boron-containing component included in the cleaning byproduct, such as a boron-containing compound, may be measured. The measured level or concentration of the boron-containing component may be further utilized to determine whether a desired level of cleaning may be achieved and/or to optimize the cleaning process.

In some embodiments, the optical absorption sensor 106 may further include one or more sensors 224, such as a pressure sensor and/or a temperature sensor, configured to measure a pressure and/or a temperature inside the optical cell 200. Although in FIG. 2, the one or more sensors 224 are located together and disposed at a cell wall of the optical cell 200, in some embodiments, the one or more sensors 224 may be disposed at separate locations, such as at different locations of the cell wall of the optical cell 200, at the inlet 202, at the outlet 206, or any other suitable location for measuring the temperature and/or pressure inside the optical cell 200. The optical absorption sensor 106 may further include a circuit board 226 electrically connecting the light source 210, light detector 212, and/or other electronic or electrical components, such as the one or more sensors 224. In some embodiments, the various components of the optical absorption sensor 106 described herein may be housed in a sensor enclosure.

Figure 3:
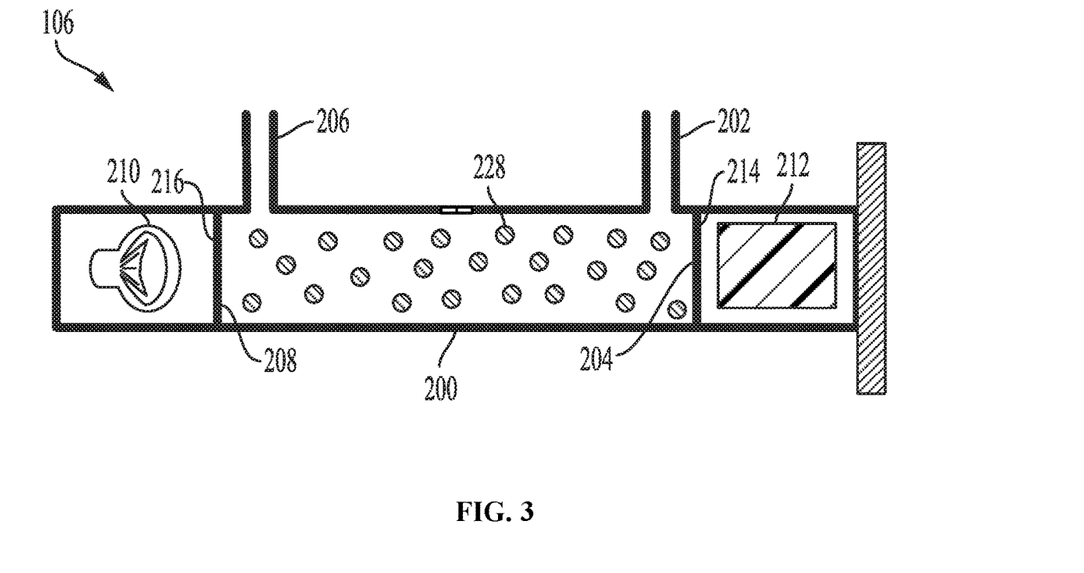
FIG. 3 schematically illustrates a fluid flow through the optical absorption sensor of FIG. 2 according to embodiments of the present technology.

FIG. 3 schematically illustrates a fluid being flowed through and analyzed by the optical absorption sensor 106 according to embodiments of the present technology. The fluid flow may be or may include a cleaning byproduct 228 that may be produced during the cleaning process and flowed from the processing chamber 102 into the optical cell 200 via the inlet 202. The cleaning byproduct 228 may then be directed to flow through the optical cell 200 along the longitudinal axis of the optical cell 200 towards the outlet 206. Light (not shown in FIG. 3) may be emitted from the light source 210 and may travel though the optical cell 200 filled with the cleaning byproduct 228. Some of the light may be absorbed by the cleaning byproduct 228, and the composition of the cleaning byproduct 228 may be analyzed based on the absorption of the light by the cleaning byproduct 228 using the light detector 212.

In some embodiments, the optical absorption sensor 106 may be configured to allow improved detection sensitivity or detection selectivity for one or more particular components of the cleaning byproduct 228. For example, to clean or remove the boron deposit from the processing chamber 102, in some embodiments, fluorine-containing plasma effluents may be used to react with the boron deposit in the processing chamber 102 to produce a volatile boron-containing compound, such as boron trifluoride. The boron-containing compound may then be flowed together with other components of the cleaning byproduct 228, such as one or more fluorine-containing component(s), nitrogen-containing component(s), etc., from the processing chamber 102 to the optical absorption sensor 106. The optical absorption sensor 106 may be configured to detect the level or concentration of the boron-containing compound contained in the cleaning byproduct 228 to determine whether a desired level of cleaning may be achieved and/or to optimize the cleaning process.

To facilitate measurement of the level or concentration of the boron-containing compound, the optical window 216 may be configured to allow light that may be absorbed by the boron-containing compound to pass through from the light source 210. For example, in some embodiments, to facilitate detection of the boron-containing compound, such as boron trifluoride, the optical window 216 may be configured to allow light, such as infrared radiation to pass and enter into the optical cell 200. The infrared radiation passing through the optical window 216 may have a wavenumber ranging between about 400 $cm^{-1}$ and about 3,000 $cm^{-1}$ or a wavelength ranging between about 2 μm and about 30 μm. These ranges may encompass multiple absorption wavelengths characteristic to boron trifluoride, which may include infrared radiation having the following wavenumbers: 490±50 $cm^{-1}$, 695±50 $cm^{-1}$, 710±50 $cm^{-1}$, 1,360±50 $cm^{-1}$, 1,480±50 $cm^{-1}$, 2,330±50 $cm^{-1}$, 2,900±50 $cm^{-1}$, and/or other characteristic wavenumbers, or infrared radiation having the following wavelengths: 4.5±0.5 μm, 7±0.5 μm, 14.5±0.5 μm, 20.5±0.5 μm, 22±0.5 μm, and/or other characteristic wavelengths.

In some embodiments, the optical window 216 may be selected and/or configured to allow radiation that may encompass more or less absorption wavelengths characteristic to boron trifluoride to pass through. In some embodiments, the optical window 216 may be selected and/or configured to allow radiation that may encompass only a single absorption wavelength characteristic to boron trifluoride to pass through. In some embodiments, the optical window 216 may be configured to pass infrared radiation having a wavenumber ranging between about 300 $cm^{-1}$ and about 1,000 $cm^{-1}$, e.g., 400 $cm^{-1}$ and about 600 $cm^{-1}$ and/or between about 500 $cm^{-1}$ and about 800 $cm^{-1}$, between about 1,200 $cm^{-1}$ and about 1,600 $cm^{-1}$, between about 2,000 $cm^{-1}$ and about 3,200 $cm^{-1}$, e.g., between about 2,100 $cm^{-1}$ and about 2,500 $cm^{-1}$, and/or between about 2,700 $cm^{-1}$ and about 3,100 $cm^{-1}$, or any other suitable ranges. Exemplary material that may be suitable for the optical window 216 may include potassium bromide, sapphire, barium fluoride, germanium, or any other suitable material that may allow radiation absorbable by boron trifluoride to pass through. The material for the optical window 216 may also be selected and/or configured to be corrosion resistant. During semiconductor processing, the various gases or precursors utilized, such as the plasma effluents of the cleaning precursor, may be corrosive. The exemplary materials described herein may not only allow radiation absorbable by boron trifluoride to pass through, but may also be resistant to corrosion by the various gases flowed through, and thus prolong the operational life of the optical absorption sensor 106.

In some embodiments, to facilitate measurement of the level or concentration of the boron-containing compound, the optical filter 214 may be selected and/or configured to allow radiation encompassing a single absorption wavelength characteristic to boron trifluoride to pass through. For example, the filter 214 may be selected and/or configured to allow infrared radiation having any of the following wavenumbers: 490±50 $cm^{-1}$, 695±50 $cm^{-1}$, 710±50 $cm^{-1}$, 1360±50 $cm^{-1}$, 1480±50 $cm^{-1}$, 2330±50 $cm^{-1}$, 2900±50 $cm^{-1}$, and/or other wavenumbers characteristic to boron trifluoride absorption, or infrared radiation having any of the following wavelengths: 4.5±0.5 µm, 7±0.5 µm, 14.5±0.5 µm, 20.5±0.5 µm, 22±0.5 µm, and/or other characteristic wavelengths characteristic to boron trifluoride absorption. In some embodiments, the filter 214 may be selected and/or configured to allow radiation encompassing two or more absorption wavelengths characteristic to boron trifluoride to pass through. Similar to the optical window 216, the various materials that may be suitable for the filter 214 may also be resistant to corrosion by the various gases flowed through the optical cell 200. As described herein, the optical window 216 and/or the filter 214 may be selected or configured specifically for detecting boron trifluoride. Without specifically configuring or selecting the optical window 216 and/or the filter 214 as described herein, effective detection of boron trifluoride under vacuum or near vacuum conditions and/or other conditions suitable for semiconductor processing may not be achieved.

Figure 4A:
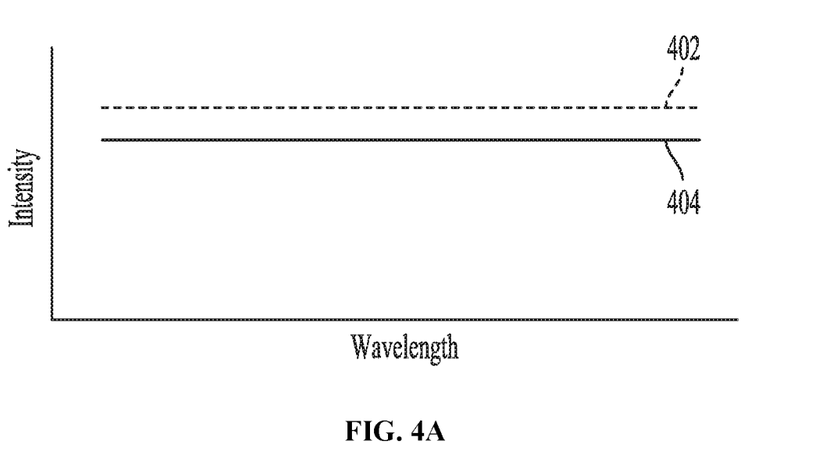
FIGS. 4A and 4B schematically illustrate exemplary radiation intensity measurements according to embodiments of the present technology.
Figure 4B:
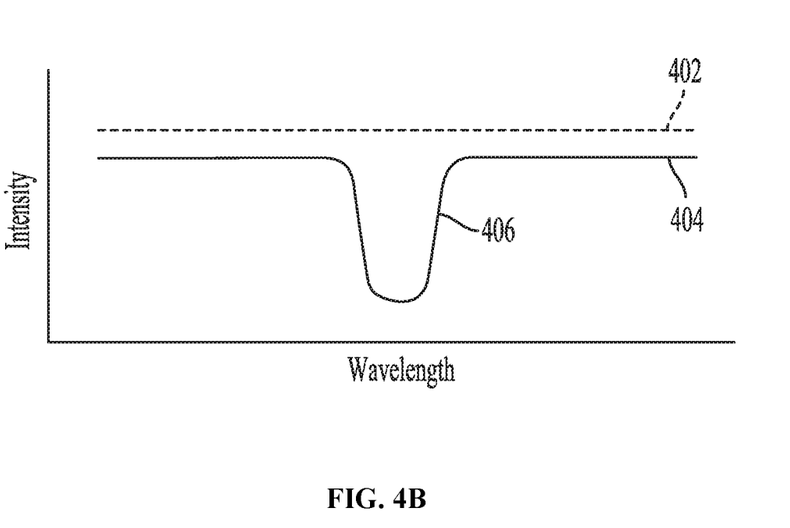

The light detector 212 may be configured to detect an intensity of the incoming light, more specifically, a decrease in the intensity of the incoming light at wavelength or wavelengths characteristic to boron trifluoride absorption due to the presence of boron trifluoride. FIGS. 4A and 4B schematically illustrate the detected radiation intensity according to embodiments of the present technology. Signal 402 in both FIGS. 4A and 4B may represent a reference signal 402 that may remain consistent during normal operation of the optical absorption sensor 106. The reference signal 402 may decrease due to degradation of the light source 210. Thus, the reference signal 402 may be utilized to conduct sensor health checks and/or periodical baseline checks. Signal 404 in FIGS. 4A and 4B may represent the intensity of radiation detected by the light detector 212 for measuring the level or concentration of fluid species of interest that may be flowed through the optical cell 200. FIG. 4A schematically illustrates the embodiments where no fluid may be flowed through the optical cell 200 or where the fluid being flowed through the optical cell 200 may not absorb any of the radiation emitted from the light source 210. Accordingly, no decrease in the intensity signal 404 may be detected. FIG. 4B schematically illustrates the embodiments where the fluid passing through the optical cell 200 may absorb at least some of the radiation, as shown in the decrease 406 in the radiation intensity as measured by the light detector 212. For example, the fluid being flowed through the optical cell 200 may be or include the cleaning byproduct flowed from the processing chamber 102 and thus may contain a boron-containing compound, such as boron trifluoride. Then the decrease 406 in the radiation intensity at the absorption wavelength characteristic to boron trifluoride may be detected due to the presence of boron trifluoride. Although the decrease 406 is only shown at or near one wavelength, decrease at or near multiple wavelengths may be detected depending on the configuration of the light source 210 and/or the light detector 212.

The detected decrease in the radiation intensity due to absorption may be used to determine a level or concentration of a particular component species contained in the fluid flowing through the optical cell 200. In some embodiments, for semiconductor processing, the level or concentration of a component species may be represented by a partial pressure of the component species. Thus, based on the radiation intensity measurements, the partial pressure of the boron-containing compound contained in the cleaning byproduct may be determined.

In some embodiments, during the cleaning process, the pressure of the cleaning byproduct being flowed through optical cell 200 may be relatively low and may range between about 1 mTorr and about 10 Torr, e.g., between about 1 mTorr and about 5 Torr, between about 1 mTorr and about 4 Torr, between about 1 mTorr and about 3 Torr, between about 1 mTorr and about 2 Torr, or between about 1 mTorr and about 1 Torr. Many conventional boron-containing compound detectors may not operate under these low pressure ranges. In contrast, the configuration of the optical absorption sensor 106 described herein may effectively detect the boron-containing compound contained in the cleaning byproduct at the relatively low pressure ranges. For example, the optical absorption sensor 106 described herein may effectively detect a partial pressure of the boron-containing compound that may be as low as less than or about 100 parts per million (ppm), less than or about 90 ppm, less than or about 80 ppm, less than or about 70 ppm, less than or about 60 ppm, less than or about 50 ppm, less than or about 40 ppm, less than or about 30 ppm, less than or about 20 ppm, less than or about 10 ppm, less than or about 5 ppm, less than or about 3 ppm, less than or about 1 ppm, or less.

In some embodiments, the detected partial pressure of the boron-containing compound may range between about 1 ppm and about 900,000 ppm, e.g., between about 1 ppm and about 500,000 ppm, between about 1 ppm and about 100,000 ppm, between about 1 ppm and about 50,000 ppm, between about 1 ppm and about 10,000 ppm, between about 1 ppm and about 5,000 ppm, between about 1 ppm and about 3,000 ppm, between about 1 ppm and about 1,000 ppm, between about 1 ppm and about 500 ppm, between about 1 ppm and about 400 ppm, between about 1 ppm and about 300 ppm, between about 1 ppm and about 200 ppm, between about 1 ppm and about 100 ppm, between about 1 ppm and about 90 ppm, between about 1 ppm and about 80 ppm, between about 1 ppm and about 70 ppm, between about 1 ppm and about 60 ppm, between about 1 ppm and about 50 ppm, between about 1 ppm and about 40 ppm, between about 1 ppm and about 30 ppm, between about 1 ppm and about 20 ppm, between about 1 ppm and about 10 ppm, between about 1 ppm and about 5 ppm, or between about 1 ppm and about 3 ppm.

Figure 5:
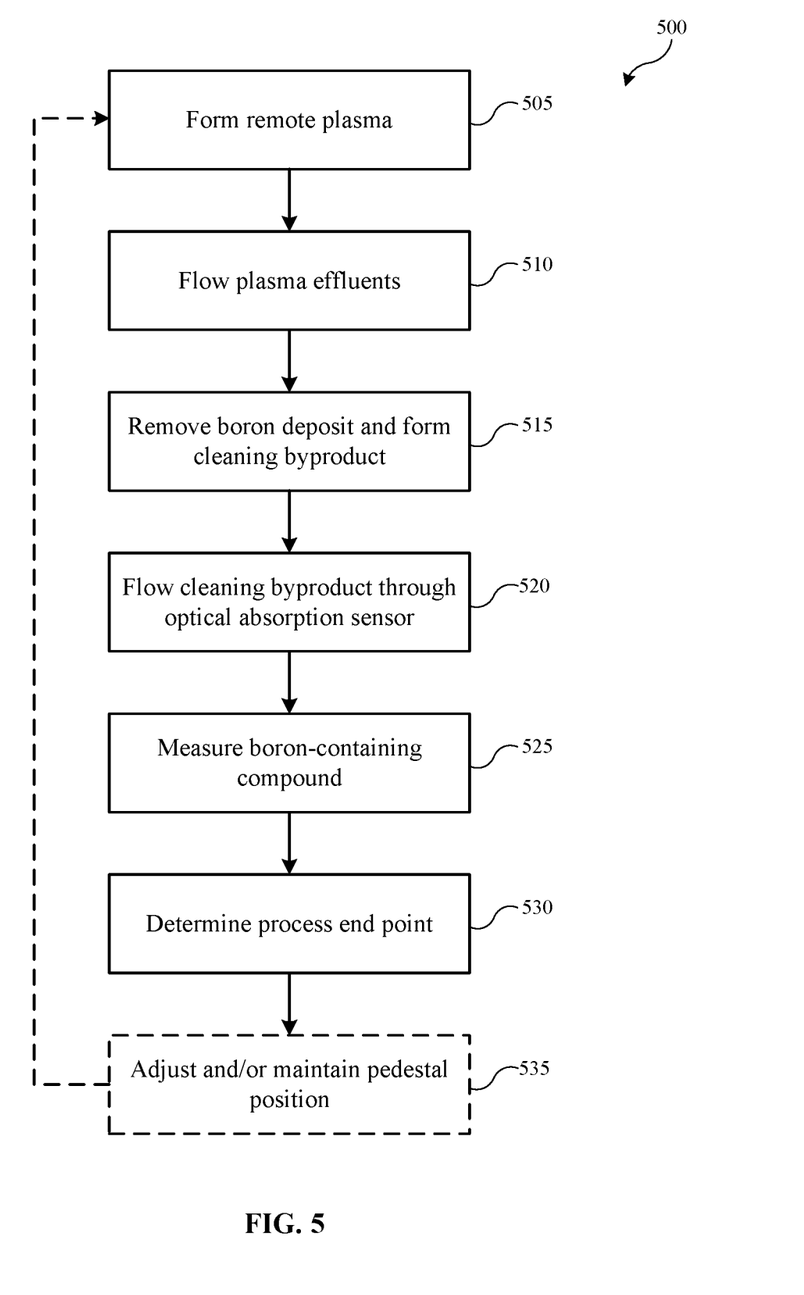
FIG. 5 shows exemplary operations in a method for process end point determination according to embodiments of the present technology.

FIG. 5 shows exemplary operations in a method 500 according to embodiments of the present technology. Method 500 may utilize an optical absorption sensor, such as the optical absorption sensor 106 discussed herein, to determine one or more process end points, such as one or more end points during a cleaning process for removing a boron deposit from a semiconductor processing chamber, such as the semiconductor processing chamber 102. For example, method 500 may utilize the optical absorption sensor 106 described herein to detect a level or concentration of a boron-containing compound, such as boron trifluoride, contained in the cleaning byproduct to determine whether an end point may be reached and/or to modify or improve the cleaning process.

Method 500 may begin at operation 505 by forming a remote plasma from a cleaning precursor to produce plasma effluents of the cleaning precursor. The cleaning precursor may include a fluorine-containing precursor, which may include one or more materials including $NF_3$, $HF$, $F_2$, $CF_4$, $CHF_3$, $C_2F_6$, $C_3F_6$, $BrF_3$, $ClF_3$, $SF_6$, or additional fluorine-substituted hydrocarbons, or fluorine-containing materials. The fluorine-containing precursor may be flowed into a remote plasma unit fluidly coupled with the semiconductor processing chamber, such as the remote plasma unit 104, to generate fluorine-containing plasma effluents. At operation 510, the fluorine-containing plasma effluents may be flowed from the remote plasma unit into the semiconductor processing chamber. At operation 515, at least a portion of the boron deposit may be removed by the fluorine-containing plasma effluents and a cleaning byproduct may be formed. Specifically, the fluorine-containing plasma effluents may react with the boron deposit inside the processing chamber to form a volatile boron-containing compound, which may include boron trifluoride.

At operation 520, the cleaning byproduct containing the boron-containing compound may be flowed from the processing chamber through the optical absorption sensor. At operation 525, the level or concentration of the boron-containing compound, such as a partial pressure of the boron-containing compound, may be measured by the optical absorption sensor. Specifically, the optical absorption sensor may be used to obtain a boron absorption signal, such as the radiation intensity decrease due to boron absorption as discussed above with reference to FIGS. 4A and 4B. The boron absorption signal may then be utilized to determine the partial pressure of the boron-containing compound. As discussed above, the operating pressure for semiconductor processing, such as cleaning of the processing chamber, may be relatively low. The pressure of the cleaning byproduct flowed from the processing chamber and through the optical absorption sensor may range between about 1 mTorr and about 10 Torr or any other ranges or sub-ranges described above. The measured level or concentration of the boron-containing compound, such as the partial pressure of the boron-containing compound, may range between about 1 ppm and about 10,000 ppm or any other ranges or sub-ranges described above.

Based on the measured level or concentration of the boron-containing compound, an end point of the cleaning process may be determined at operation 530. In some embodiments, a process end point may be determined when the absorption measurement may fall within a predetermined window. Referring back to FIG. 4B, the decrease 406 in the detected intensity may indicate the presence of the boron-containing compound, which may be formed by reacting the boron deposit with the fluorine-containing plasma effluents. When the decrease in intensity may become less and/or fall within a predetermined window, it may be determined that the end point for the cleaning process may be reached. The cleaning process may then be stopped or paused by stopping or pausing the flow of the fluorine-containing plasma effluents into the processing chamber. In some embodiments, it may be determined that the process end point may be reached when no decrease may be detected or when the decrease in intensity may be less than or about 10%, less than or about 5%, less than or about 3%, less than or about 1%, or less, as compared to the intensity with no absorption.

In some embodiments, the end point may be determined using the measured level or concentration of the boron-containing compound, such as the measured partial pressure of the boron-containing compound, or the change in the measured level or concentration of the boron-containing compound. In some embodiments, it may be determined that the process end point may be reached when the measured partial pressure change slope may be less than a predetermined value over a predetermined period of time. Depending on the application, it may be determined that the process end point may be reached when the measured partial pressure change slope may be less than 0.2, 0.15, 0.1, 0.05, 0.03, 0.01, or less over a period of about 30 seconds, about 20 seconds, about 10 seconds, about 5 seconds, or about 1 second. In some embodiments, it may be determined that the process end point may be reached when the measured partial pressure change slope may be less than 0.1 over about 10 seconds. In some embodiments, it may be determined that the process end point may be reached when the detected partial pressure of the boron-containing compound may be less than or about 30 ppm, less than or about 20 ppm, less than or about 15 ppm, less than or about 10 ppm, less than or about 5 ppm, less than or about 4 ppm, less than or about 3 ppm, less than or about 2 ppm, less than or about 1 ppm, or less.

In some embodiments, a variation in the detected level or concentration of the boron-containing compound may be utilized for determining process end point. Specifically, as the cleaning process may approach the process end point, a gradual decrease in the detected level or concentration of the boron-containing compound may be observed. It may be determined that the process end point may be reached when the detected level or concentration of the boron-containing compound may stop decreasing or when the measured level or concentration of the boron-containing compound may remain substantially the same for a predetermined period of time. In some embodiments, it may be determined that the process end point may be reached when a variation, such as a decrease, in the measured level or concentration of the boron-containing compound within the predetermined period of time is less than or about 10 ppm, less than or about 8 ppm, less than or about 7 ppm, less than or about 6 ppm, less than or about 5 ppm, less than or about 4 ppm, less than or about 3 ppm, less than or about 2 ppm, less than or about 1 ppm, or less. The predetermined period of time may range between about 60 seconds and about 1 second, and may be about 60 seconds, about 50 seconds, about 40 seconds, about 30 seconds, about 20 seconds, about 10 seconds, about 9 seconds, about 8 seconds, about 7 seconds, about 6 seconds, about 5 seconds, about 4 seconds, about 3 seconds, about 2 seconds, or about 1 second. When the process end point may be determined, the flow of the plasma effluents of the cleaning precursor into the processing chamber may be stopped or paused.

In some embodiments, method 500 may further include at operation 535, adjusting the position of a pedestal within the processing chamber and/or maintaining the pedestal at different positions. The pedestal may be the same as or similar to the pedestal 114 discussed above with reference to FIG. 1. The pedestal may be configured to move axially along an axis of the semiconductor processing chamber. By adjusting the pedestal to different axial positions and/or maintaining the pedestal at the various axial positions, the plasma effluents of the cleaning precursor may be directed to flow towards various parts or portions of the processing chamber to perform a thorough cleaning of the processing chamber. Once the pedestal may be moved to a new axial position, operations 505-530 may be repeated until another process end point may be detected. Thus, in some embodiments, the cleaning of the processing chamber may be performed in multiple stages when the pedestal may be moved to and/or maintained at different axial positions.

For example, when method 500 may be performed, the pedestal may be moved to a first axial position. The plasma effluents may be flowed into the semiconductor processing chamber while the pedestal may be maintained at the first axial position until a first process end point may be detected. The pedestal may then be moved to a second axial position and maintained at the second axial position while flowing the plasma effluents into the semiconductor processing chamber until a second process end point may be detected. The pedestal may then be moved to and maintained at a third axial position, fourth axial position, etc., depending on the cleaning process implemented. Operations 505-535 may be repeated when the pedestal may be moved to different positions to clean the various parts and portions of the processing chamber. Depending on the cleaning process, when the pedestal may be moved from one axial position to another, the pedestal may be gradually lowered or moved away from a chamber lid or showerhead in some embodiments. In some embodiments, the pedestal may be moved up or raised to different axial positions during the cleaning processing. In some embodiments, the pedestal may be moved up and down throughout the cleaning process.

By detecting the process end point, under-cleaning may be avoided to ensure thorough cleaning of the processing chamber, to reduce particles contamination, and/or to improve uniformity during subsequent semiconductor substrate processing. Over-cleaning may also be avoided by stopping or pausing the flow of the plasma effluents of the cleaning precursor once the process end point may be detected. The cleaning time for each stage, if a multi-staged cleaning process may be implemented, may be optimized, and the overall process efficiency and/or productivity may be improved. Further, by utilizing the optical absorption sensor described herein to detect the process end point at a location downstream of the processing chamber, interruption of the deposition and/or cleaning process may be avoided or prevented.

Although process end point detection has been described as an example, the optical absorption sensor and the method described herein may also be used to determine the start or onset of the cleaning process. For example, the optical absorption sensor and the methods described herein may be implemented to detect a decrease in the radiation intensity at one or more wavelengths characteristic to boron absorption, which may indicate the presence of the boron-containing compound, such as boron trifluoride, in the cleaning byproduct and thus the onset of the cleaning process. The start or onset of the cleaning process may also be determined by a threshold value of the level or concentration of the boron-containing compound contained in the cleaning byproduct. Depending on the process, the threshold value for determining the onset of the cleaning process may be greater than or about 1 ppm, greater than or about 2 ppm, greater than or about 3 ppm, greater than or about 4 ppm, greater than or about 5 ppm, greater than or about 10 ppm, greater than or about 15 ppm, greater than or about 20 ppm, greater than or about 30 ppm, or greater. Thus, if the start or onset of the cleaning process may not be detected after flowing the plasma effluents of the cleaning precursor for a predetermined time, the flowing of the plasma effluents of the cleaning precursor may be paused and/or stopped, and the operating condition of the sensor and/or the chamber system may be checked to avoid excessive etching of the chamber components by the plasma effluents of the cleaning precursor.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s) ", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method of cleaning a semiconductor system, comprising:
    forming a remote plasma from a fluorine-containing precursor to produce plasma effluents of the fluorine-containing precursor;
    flowing the plasma effluents into a semiconductor processing chamber of the semiconductor system, wherein the semiconductor processing chamber contains a solid boron deposit;
    removing at least a portion of the solid boron deposit with the plasma effluents, whereby a cleaning byproduct including a boron-containing compound is formed;
    flowing the cleaning byproduct from the semiconductor processing chamber through an optical absorption sensor, wherein a pressure of the cleaning byproduct flowed through the optical absorption sensor ranges between about 1 mTorr and about 10 Torr;
    measuring a level of the boron-containing compound in the cleaning byproduct flowed through the optical absorption sensor; and
    determining a process end point when a change slope of a measured level of a partial pressure of the boron-containing compound is less than 0.1 ppm over about 10 seconds.

2. The method of claim 1, wherein the boron-containing compound comprises $BF_3$.

3. The method of claim 1, wherein the measured level of the boron-containing compound flowed through the optical absorption sensor ranges between about 1 ppm and about 900,000 ppm.

4. The method of claim 1, wherein measuring the level of the boron-containing compound in the cleaning byproduct flowed through the optical absorption sensor comprises obtaining a boron absorption signal using the optical absorption sensor.

5. The method of claim 1, wherein forming the remote plasma comprises forming the remote plasma in a remote plasma unit of the semiconductor processing system that is fluidly coupled with the semiconductor processing chamber.

6. The method of claim 1, wherein the fluorine-containing precursor comprises $NF_3$.

7. The method of claim 1, wherein the semiconductor processing chamber comprises a pedestal configured to move axially along an axis of the semiconductor processing chamber, the method further comprising:
   maintaining the pedestal at a first axial position while flowing the plasma effluents into the semiconductor processing chamber;
   maintaining the pedestal at a second axial position while flowing the plasma effluents into the semiconductor processing chamber, wherein measuring the level of the boron-containing compound flowed through the optical absorption sensor comprises:
measuring a first level of the boron-containing compound flowed through the optical absorption sensor while maintaining the pedestal at the first axial position; and
measuring a second level of the boron-containing compound flowed through the optical absorption sensor while maintaining the pedestal at the second axial position.

8. The method of claim 7, further comprising:
moving the pedestal from the first axial position to the second axial position when a change slope of the measured level of the partial pressure of the boron-containing compound is less than 0.1 ppm over about 10 seconds.

* * * * *